United States Patent
Bacquet

(10) Patent No.: US 9,620,825 B2
(45) Date of Patent: Apr. 11, 2017

(54) COMMUNICATION SYSTEM TO COMMUNICATE WITH AN ELECTRICAL DEVICE CONNECTED TO OR IN AN ELECTRIC BATTERY

(71) Applicant: RENAULT s.a.s., Boulogne-billancourt (FR)

(72) Inventor: Sylvain Bacquet, Chasselay (FR)

(73) Assignee: RENAULT s.a.s., Boulogne-billancourt (FR)

( * ) Notice: Subject to any disclaimer, the term of this patent is extended or adjusted under 35 U.S.C. 154(b) by 341 days.

(21) Appl. No.: 14/374,344

(22) PCT Filed: Jan. 24, 2013

(86) PCT No.: PCT/EP2013/051368
§ 371 (c)(1),
(2) Date: Jan. 26, 2015

(87) PCT Pub. No.: WO2013/113617
PCT Pub. Date: Aug. 8, 2013

(65) Prior Publication Data
US 2015/0318583 A1 Nov. 5, 2015

(30) Foreign Application Priority Data
Jan. 31, 2012 (FR) ...................................... 12 50871

(51) Int. Cl.
*H01M 10/44* (2006.01)
*H01M 10/46* (2006.01)
(Continued)

(52) U.S. Cl.
CPC ...... *H01M 10/482* (2013.01); *G01R 31/3675* (2013.01); *H04B 3/548* (2013.01);
(Continued)

(58) Field of Classification Search
CPC .......... H02J 7/0042; H02J 7/355; H02J 7/025; H02J 5/005
(Continued)

(56) References Cited

U.S. PATENT DOCUMENTS 6,140,800 A * 10/2000 Peterson ............... H02J 7/0018
320/103
7,059,769 B1 6/2006 Potega
(Continued)

FOREIGN PATENT DOCUMENTS

EP      2 296 214      3/2011
JP      2005 63956     3/2005

OTHER PUBLICATIONS

International Search Report Issued Mar. 8, 2013 in PCT/EP13/051368 Filed Jan. 24, 2013.
(Continued)

*Primary Examiner* — Edward Tso
(74) *Attorney, Agent, or Firm* — Oblon, McClelland, Maier & Neustadt, L.L.P.

(57) ABSTRACT

A system in a battery in which a plurality of elementary cells are connected between two first nodes. The system includes: a first device configured to apply an alternating signal to the first nodes; at least one second device connected to the second nodes of the cells; and at least one resonant element, an inductive element of which includes an inductance itself of the battery between the two nodes.

15 Claims, 2 Drawing Sheets

(51) Int. Cl.
   *H01M 10/48*   (2006.01)
   *G01R 31/36*   (2006.01)
   *H04B 3/54*   (2006.01)
   *H01M 10/42*   (2006.01)
   *H02J 7/00*   (2006.01)
   *H02J 7/02*   (2016.01)

(52) U.S. Cl.
   CPC ...... *H01M 10/4207* (2013.01); *H01M 10/486* (2013.01); *H02J 7/0021* (2013.01); *H02J 7/025* (2013.01); *H04B 2203/5458* (2013.01); *Y02T 10/7055* (2013.01)

(58) Field of Classification Search
   USPC .............. 320/108, 110, 112, 116; 429/96, 99
   See application file for complete search history.

(56) References Cited

U.S. PATENT DOCUMENTS

2010/0079146 A1   4/2010   Kurose et al.
2011/0205035 A1   8/2011   Abe et al.

OTHER PUBLICATIONS

French Search Report Issued Sep. 3, 2012 in French Patent Application No. 1250871 Filed Jan. 31, 2012.

\* cited by examiner

COMMUNICATION SYSTEM TO COMMUNICATE WITH AN ELECTRICAL DEVICE CONNECTED TO OR IN AN ELECTRIC BATTERY

FIELD OF THE INVENTION

The present invention relates to communications between a master device and one or more slave devices in an electric battery.

PRIOR ART

An electric battery is a grouping of a number of elementary cells (storage cells, accumulators, etc.) connected in series and/or in parallel between two nodes or terminals supplying a DC voltage.

The cells of the battery are generally housed in a protective casing only allowing access via two connections connected to the two terminals of the battery.

In some applications, for example in the field of batteries for electric vehicles, it is desirable to be able to interrogate sensors or other electronic devices arranged inside the protective casing, for example temperature sensors placed on cells of the battery, electronic identification tags, or any other type of device.

For this, it is possible to provide wired communication between a reader (master device) arranged outside the casing of the battery, and the sensors or other objects to be interrogated (slave devices) arranged inside the casing. One disadvantage lies in the need to allow cables to exit from the casing, which involves providing connectors and a risk that said cables may be pulled out. In addition, the number of cables necessary for the instrumentation of a battery may be significant, leading to a not insignificant rise of the cost price of the battery. Furthermore, the cables may sense electromagnetic interference likely to alter the data signals between the master device and the slave devices.

To avoid the disadvantages of wired communication, it is possible to use communications by radio waves (without contact) between the master device and the slave devices. However, the environment, which is often highly metallic, makes such communications difficult and random.

It would be desirable to be able to provide a reliable and cost-effective means for communicating with sensors or other devices arranged inside a battery.

Documents US2010/0079146, EP2296214 and U.S. Pat. No. 7,059,769 describe examples of communication systems in electric batteries.

SUMMARY

One object of an embodiment of the present invention is thus aimed at a system for communicating between a master device and at least one slave device in an electric battery, this system overcoming some of the disadvantages of the known systems, at least in part.

A further object of an embodiment of the present invention is to provide a communication system that is more reliable than the known systems.

A further object of an embodiment of the present invention is to provide a communication system that is less costly than the known systems.

A further object of an embodiment of the present invention is to provide a method for communicating between a master device and a number of slave devices in an electric battery.

One embodiment of the present invention thus provides a system comprising: a battery in which a plurality of elementary cells are connected between two first nodes; a first device suitable for applying an alternating signal to the first nodes; at least one second device connected to two second nodes of the plurality of cells; and at least one resonant assembly, of which an inductive element comprises the inductor belonging to the battery between the second nodes.

In accordance with one embodiment of the present invention, the resonant assembly comprises at least one capacitive element of said at least one second device.

In accordance with one embodiment of the present invention, said at least one second device is suitable for communicating with the first device by modulation of said alternating signal seen by the second nodes.

In accordance with one embodiment of the present invention, the resonance frequency of said resonant assembly is approximately equal to the frequency of said alternating signal.

In accordance with one embodiment of the present invention, the resonance frequency of said resonant assembly is between 30 kHz and 30 MHz.

In accordance with one embodiment of the present invention, the second nodes are two power terminals of the same elementary cell.

In accordance with one embodiment of the present invention, the cells of the battery are connected in series between said first nodes.

In accordance with one embodiment of the present invention, the cells of the battery are connected in parallel between the first nodes.

In accordance with one embodiment of the present invention, said at least one second device comprises a processing circuit comprising two third nodes, said at least one second device comprising isolation capacitors between the third nodes and the second nodes.

In accordance with one embodiment of the present invention, the first device comprises an alternating generator and an impedance transformer between said generator and said first nodes.

In accordance with one embodiment of the present invention, the first device comprises frequency tuning capacitors and isolation capacitors between said transformer and said first nodes.

The present invention also provides an electric battery comprising: a plurality of elementary cells connected between two first nodes; at least one device connected to two second nodes of said plurality of cells; and at least one resonant assembly, of which an inductive element comprises the inductor belonging to the battery between said second nodes.

In accordance with one embodiment of the present invention, said at least one device is suitable for modulating an alternating signal received by the second nodes.

In accordance with one embodiment of the present invention, the resonant assembly comprises at least one capacitive element of said at least one device.

In accordance with one embodiment of the present invention, said at least one device is arranged inside an elementary cell of the battery.

In accordance with one embodiment of the present invention, said at least one device comprises a sensor able to measure the temperature of the electrolyte of the cell.

In accordance with one embodiment of the present invention, a plurality of elementary cells are connected between two first nodes, between a first device connected to said first nodes and to at least one second device connected to two second nodes of said plurality of cells, said method comprising the following steps:

on the side of the first device, applying an alternating signal to said first nodes; and on the side of the second device, receiving the alternating signal via at least one resonant assembly, of which an inductive element comprises the inductor belonging to the battery between the second nodes, and modulating said signal.

BRIEF DESCRIPTION OF THE DRAWINGS

These objects, characteristics and advantages as well as others will be presented in detail in the following description of specific embodiments given by way of non-limiting example with reference to the accompanying figures, in which.

DETAILED DESCRIPTION

Like elements have been denoted by like references in the different figures. For the sake of clarity, only those elements useful for the comprehension of the invention have been shown and will be described. In particular, the functions of slave devices have not been detailed, the embodiments being compatible with the usual electronic devices likely to be placed within an electric battery.

Figure 1:
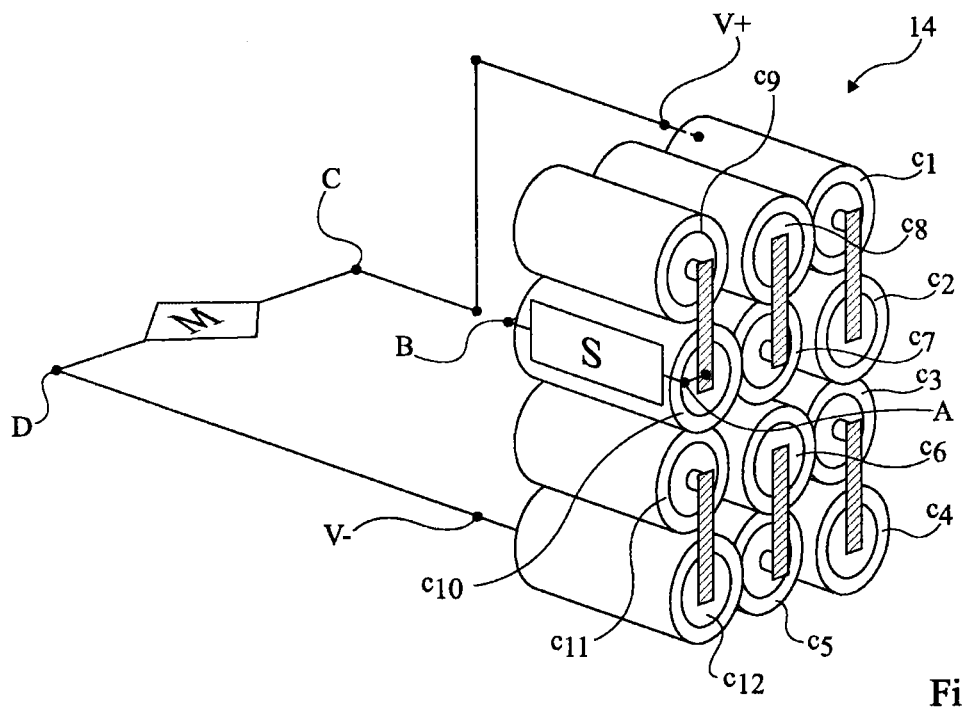
FIG. 1 is a perspective view schematically showing an embodiment of a system for communicating between a master device and a slave device contained in an electric battery.

FIG. 1 is a perspective view schematically showing an example of an embodiment of a system for communicating between a master device M (or reader) and at least one slave device S in an electric battery 14. In this example, the battery 14 comprises twelve elementary cells $c_1$ to $c_{12}$ connected in series between terminals V+ and V− supplying a DC voltage. For example, the slave device S comprises a temperature sensor or an electronic identification tag and is connected to the terminals of an elementary cell of the battery (the cell $c_{10}$ in this example) by means of two contacts A and B. The master device M is connected to the primary terminals V+ and V− of the battery 14 by means of two contacts C and D.

In accordance with one aspect of the described embodiment, the master device M is suitable for applying an alternating signal across the primary terminals V+ and V− of the battery, that is to say is suitable for emitting, over the power path of the battery, an alternating signal superimposing the DC voltage of the battery. The slave device S, which is connected in parallel with a portion of the power path of the battery, is suitable for communicating with the device M by demodulating and/or by modulating the alternating signal seen across the terminals A and B of said slave device.

For the sake of clarity, no protective casing of the battery 14 has been shown in FIG. 1. If a protective casing had to be provided, the slave device S could be housed within the casing, and the master device M could be arranged outside the casing, and connected to the terminals V+ and V−.

Figure 2:
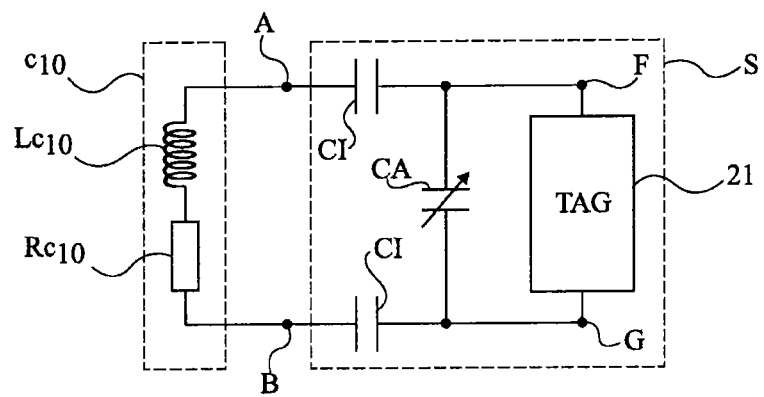
FIG. 2 is a circuit diagram illustrating an embodiment of a slave device associated with an elementary cell of an electric battery.

FIG. 2 is a circuit diagram illustrating in greater detail an embodiment of the slave device S connected to the elementary cell $c_{10}$ of the electric battery 14 of FIG. 1.

From the viewpoint of the alternating signal emitted by the master device M (not visible in FIG. 2) and propagated over the power path of the battery, the elementary cell $c_{10}$ behaves similarly to an inductor $Lc_{10}$ in series with a resistor $Rc_{10}$. The values of the inductor $Lc_{10}$ and of the resistor $Rc_{10}$ are dependent, inter alia, on the method of manufacture of the cell $c_{10}$, the structure thereof, etc.

In accordance with one aspect of the described embodiment, the slave device S forms a resonant assembly together with the inductor $Lc_{10}$ and the resistor $Rc_{10}$ belonging to the cell $c_{10}$ to the terminals of which said slave device is connected.

The slave device S comprises a primary circuit 21 (TAG), or processing circuit, comprising two terminals F and G for applying an alternating signal. Two isolation capacitors (or decoupling capacitors) CI are provided, one between the terminal A and the terminal F and the other between the terminal B and the terminal G so as to prevent the DC voltage of the cell $c_{10}$ from being applied to the terminals F and G of the circuit 21. The circuit 21, at the terminals thereof, thus only sees the alternating signal propagated by the master device M over the power path of the battery. The capacitors CI in particular make it possible to prevent the cell $c_{10}$ from discharging into the circuit 21. The device S further comprises a capacitor CA for tuning the resonance frequency of the assembly formed by the device S, the inductor $Lc_{10}$, and the resistor $Rc_{10}$. In this example, the capacitor CA is connected between the terminals F and G. The capacitor CA for example is a capacitor with variable capacitance. The capacitor CA is selected depending on the frequency of the alternating signal applied by the device M to the terminals V+ and V− of the battery, such that the resonant assembly formed by the device S and the cell $c_{10}$ resonates at this frequency. Thus, the alternating signal seen by the circuit 21 across the terminals F and G thereof is an amplified copy of the alternating signal propagated by the master device M over the power path of the battery. In practice, the resonance frequency of the resonant assembly is basically dependent on the capacitor CA and on the inductor $Lc_{10}$.

The circuit 21 for example comprises a circuit for modulating the alternating signal seen across the terminals F and G thereof, thus enabling said circuit to emit data to the master device M via the power path of the battery. The data emitted by the circuit 21 may be an identification number contained in the memory of the circuit 21, a temperature measurement taken by a sensor of the circuit 21, or any other data. In order to modulate the alternating signal propagated over the power path of the battery, the circuit 21 may for example vary the impedance thereof, causing a variation of amplitude of the alternating signal propagated over the power path of the battery. However, any other suitable modulation method could be used (frequency modulation, phase modulation, etc.). The circuit 21 may also comprise a circuit for demodulating the alternating signal seen across the terminals F and G thereof, so as to permit bidirectional communication between the master device M and the slave device S.

For the supply thereof with electrical energy, the circuit 21 may comprise a power supply block (not shown), comprising means for rectifying the alternating signal seen by the terminals F and G and for providing a rectified DC voltage to the terminals of a capacitor. This means that the circuit 21 does not draw the electrical supply energy thereof directly in the cell $c_{10}$, but in the alternating signal emitted by the reader M (on the understanding that the reader M can be fed either by the battery 14 or by an external source).

In a preferred embodiment, it is possible to benefit from the fact that there are already numerous sensors or other electronic devices (for example for identification) suitable for communicating by radio waves with a remote reader, generally in accordance with standardized protocols. For example, sensors exist that are equipped with an antenna or comprise terminals for connection to an antenna and already comprise circuits for modulating, demodulating or producing a DC supply voltage by rectifying an alternating signal provided by the antenna. It is proposed here to use an existing sensor or other device of this type to produce the circuit 21 (TAG). If the existing device already comprises an antenna, this antenna is removed beforehand, otherwise the existing device can be used as it is. The terminals F and G by means of which the existing device is connected to the capacitors CI and CA are the terminals normally intended for connection to an antenna. The existing device can be used without other modification because, from the viewpoint of the sensor, it is irrelevant whether the alternating signal seen across the terminals F and G is propagated from or toward the master device by air (by means of an antenna) or by the power path of the battery.

By way of example, in order to provide the slave devices it is possible to use sensors or other electronic devices normally intended for use in contactless communication systems of the RFID (radio frequency identification) type. For example, it is possible to use devices suitable for functioning in accordance with a communication protocol described in the standard ISO 15693, normally aimed at contactless communication by radio waves over a carrier frequency at 13.56 MHz. The frequency of the alternating signal emitted by the master device M is then regulated at 13.56 MHz, and the capacitor CA for tuning the slave device S is selected such that the resonance frequency of the resonant assembly comprising the slave device S and the cell $c_{10}$ is approximately 13.56 MHz.

Similarly to the slave device S the master device M can be produced on the basis of an existing reader comprising an alternating signal generator intended for connection to an antenna and means for modulating and/or demodulating signals emitted and/or received by the antenna. If the existing reader already comprises an antenna, this antenna is removed beforehand. The terminals V+ and V− of the battery can be connected instead of the antenna by means of isolation or decoupling capacitors making it possible to prevent the DC voltage of the battery from being applied to the reader.

The described embodiments of course are not limited to the reuse of existing elements of systems for contactless communication by radio waves. For example, a specific communication protocol could also be provided, and master and slave devices specifically dedicated to the implementation of this protocol could also be provided. In particular, any working frequency other than 13.56 MHz could be used. The inventors have found that frequencies between 30 kHz and 30 MHz are particularly suitable for implementing robust communications via the power path of the battery.

Figure 3:
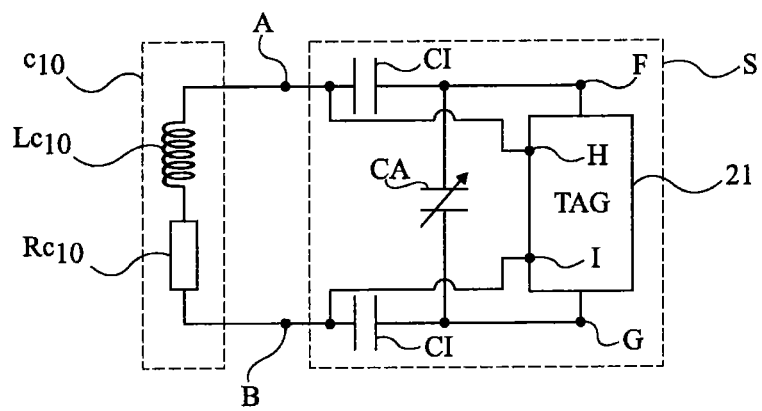
FIG. 3 is a circuit diagram illustrating a variant of the slave device of FIG. 2.

FIG. 3 is a circuit diagram illustrating a variant of the slave device S of FIG. 2. The device of FIG. 3 differs from the device of FIG. 2 in that the circuit is not fed by rectification of the alternating signal seen across the terminals F and G thereof, but by a DC voltage drawn directly at the terminals of the cell to which the device S is connected. Besides the terminals F and G for application of an alternating signal, the circuit 21 comprises terminals H and I for application of a DC supply voltage. The terminals H and I are connected respectively to the terminals A and B of the device S, that is to say upstream of the isolation capacitors CI. Thus, when the device S is connected to the terminals of a cell of the battery, the terminals H and I directly receive the DC voltage delivered by this cell.

Figure 4:
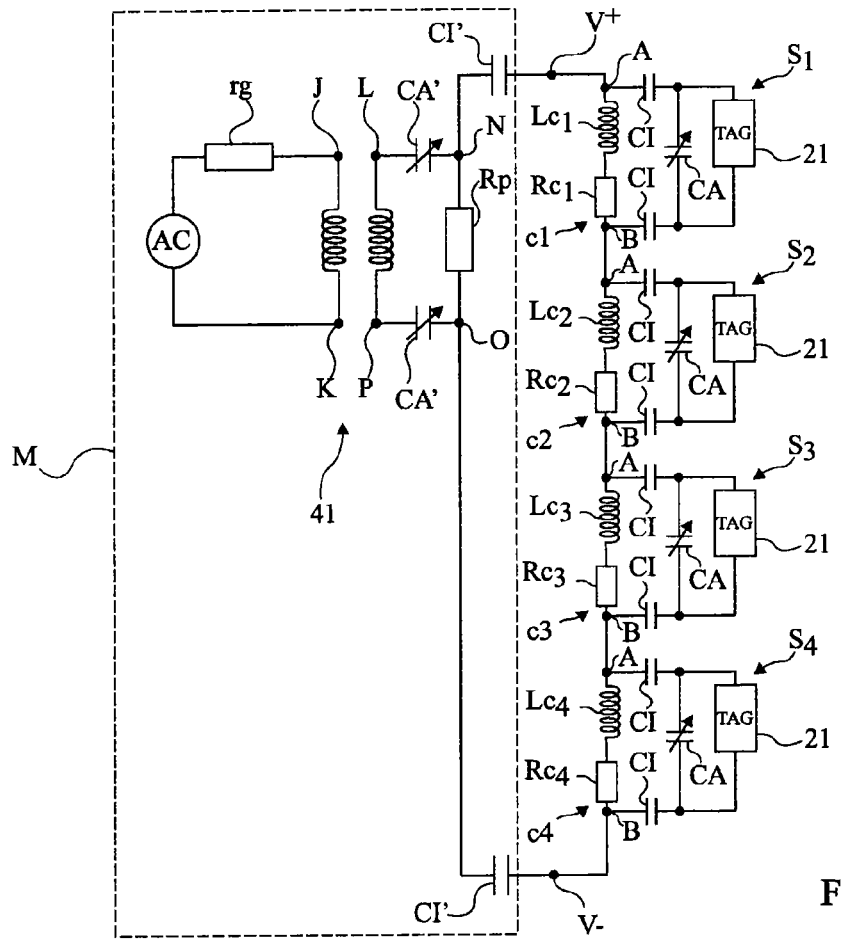
FIG. 4 is a circuit diagram illustrating an embodiment of a system for communicating between a master device and slave devices contained in an electric battery in which elementary cells are connected in series.

FIG. 4 is a circuit diagram illustrating an exemplary embodiment of a system for communicating between a master device M and slave devices $S_i$ in an electric battery in which elementary cells $c_i$ are connected in series between the terminals V+ and V− of the battery (one slave device per cell, i ranging from 1 to 4 in this example). For example, the slave devices $S_1$ to $S_4$ are devices of the type described with reference to FIG. 2 and are connected in parallel with cells $c_1$ to $c_4$ respectively (in FIG. 4 each cell $c_i$ is shown schematically by an inductor $Lc_i$ in series with a resistor $Rc_i$). Alternatively, only some of the cells of the battery could be equipped. In addition, it would be possible to connect a slave device $S_i$ not in parallel with an elementary cell $c_i$ as shown in the figures, but in parallel with a chain of at least two elementary cells in series.

The resonance is adjusted by the tuning capacitors CA. This adjustment is dependent in particular on the number of instrumented cells. If a slave device $S_i$ is connected in parallel with a chain of a number of elementary cells $c_i$ in series, the inductance and the resistance of this chain of cells would have to be taken into consideration for the adjustment of the resonance.

In the example of FIG. 4, the master device M is modeled by a generator AC of alternating signal in series with a resistor rg (resistor within the generator). In order to provide a good transfer of energy, it is preferable for the charge seen by the generator at the output terminals J and K thereof to be equal to the internal impedance rg thereof (typically 50 ohms). In order to adapt the impedance, an impedance transformer 41 can be provided between the output terminals J and K of the generator AC and terminals L and P connected respectively to the terminals V+ and V− of the battery. In this example, the terminal L is connected to the terminal V+ by means of a tuning capacitor CA' in series with an isolation capacitor CI', and the terminal O is connected to the terminal V− via a second capacitor CA' in series with a second capacitor CI'.

Ideally, the impedance (charge) seen by the transformer at the terminals L and P thereof must be purely real. The tuning capacitors CA', for example capacitors with variable capacitance, are provided in order to compensate for the parasitic inductances associated with the connection elements between the cells of the battery.

The isolation or decoupling capacitors CI' are provided in order to prevent the DC voltage of the battery from being applied to the terminals L and P of the impedance transformer 41.

A protective resistor Rp can be provided between a node N common to the first capacitor CA' and to the first capacitor CI', and a node O common to the second capacitor CA' and the second capacitor CI'. The resistor Rp makes it possible in particular to discharge the isolation capacitors CI' in case of disconnection of the battery.

Besides the elements shown in FIG. 4, the master device M may comprise means for modulating and/or demodulating alternating signals emitted and/or received by means of the power path of the battery, and processing means for coding and/or decoding the emitted and/or received messages.

Figure 5:
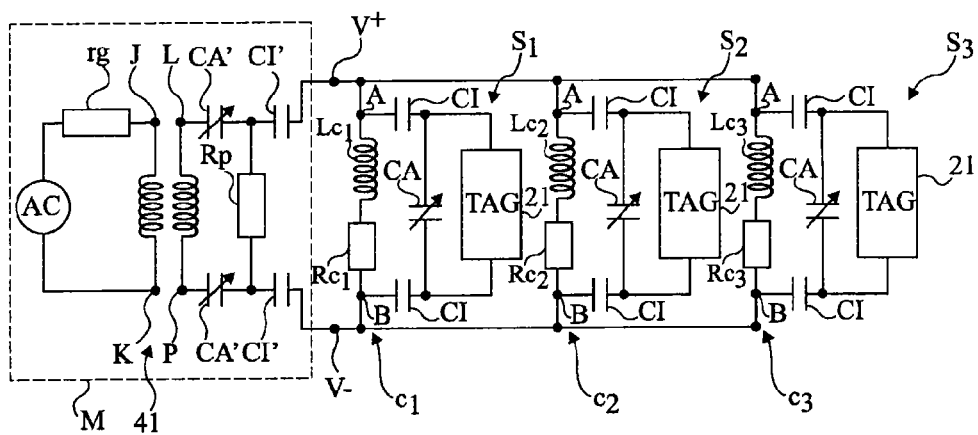
FIG. 5 is a circuit diagram illustrating an embodiment of a system for communicating between a master device and slave devices in an electric battery in which elementary cells are connected in parallel.

FIG. 5 is a circuit diagram illustrating an exemplary embodiment of a system for communicating between a master device M and slave devices $S_i$ in an electric battery in which elementary cells $c_i$ are connected in parallel between the terminals V+ and V− of the battery (one slave device per cell, i ranging from 1 to 3 in this example). In the shown example, the master device M and the slave devices $S_i$ are of the same type as in the example of FIG. 4, but the slave devices $S_i$ of the system of FIG. 5 are connected in parallel between the terminals V+ and V−, and not in series as in the system of FIG. 4. The resonance is adjusted by the tuning capacitors CA.

One advantage of the proposed communication mode is that it enables reliable communications between a master device and at least one slave device in an electric battery.

In particular, this communication mode is not very sensitive to environmental disturbances.

In addition, it is not necessary to provide cables passing from the inside to the outside of the battery.

In addition, the resonators used, on the side of the slave devices, for communicating with the master device use the inductor belonging to the cells of the battery as a resonant element. This makes it possible to save components (inductors).

Specific embodiments have been described. Different variants and modifications will be clear to a person skilled in the art.

In particular, it is known that a battery can be divided into a number of modules each comprising a plurality of cells connected in series or in parallel between two contact nodes or terminals of the module, the modules being connected in series or in parallel between the terminals of the battery. Although this has not been mentioned above, a person skilled in the art will know to add the modularity to the communication system described above. For example, in a battery having a number of modules, it is possible to provide a master device of first rank for each module or group of modules, a master device of greater rank being provided in order to communicate with the master devices of lower rank (arborescent network). A person skilled in the art will generally know how to adapt any known network structure to the communication mode described. Where necessary, a person skilled in the art will know to provide suitable communication protocols. In particular, a person skilled in the art will be able to use a number of carrier frequencies in the same battery.

In addition, although FIG. 1 shows a slave device S arranged outside an elementary cell of the battery, the communication mode described also makes it possible to provide sensors within cells, for example a sensor for sensing the temperature of the electrolyte. The proposed communication system is then particularly advantageous since it makes it possible to pass from any specific connection (other than the power terminals of the cell) to outside the cell.

The invention claimed is:
1. A system comprising:
   a battery in which a plurality of elementary cells are connected between a first set of two nodes;
   a first device configured to apply an alternating signal to the first set of two nodes;
   at least one second device connected to a second set of two nodes of the plurality of elementary cells; and
   at least one resonant assembly, of which an inductive element comprises an inductor belonging to the battery, between the second set of two nodes.

2. The system as claimed in claim 1, wherein the at least one resonant assembly comprises at least one capacitive element of the at least one second device.

3. The system as claimed in claim 1, wherein the at least one second device is configured to communicate with the first device by modulation of an alternating signal seen by the second set of two nodes.

4. The system as claimed in claim 3, wherein a resonance frequency of the resonant assembly is approximately equal to a frequency of the alternating signal seen by the second set of two nodes.

5. The system as claimed in claim 1, wherein a resonance frequency of the resonant assembly is between 30 kHz and 30 MHz.

6. The system as claimed in claim 1, wherein the second set of two nodes are two power terminals of a same elementary cell of the plurality of elementary cells.

7. The system as claimed in claim 1, wherein the at least one second device comprises:
   a processing circuit comprising a third set of two nodes, and
   isolation capacitors between the third set of two nodes and the second set of two nodes.

8. The system as claimed in claim 1, wherein the first device comprises an alternating generator and an impedance transformer between the alternating generator and the first set of two nodes.

9. The system as claimed in claim 8, wherein the first device comprises frequency tuning capacitors and isolation capacitors between the impedance transformer and the first set of two nodes.

10. An electric battery comprising:
    a plurality of elementary cells connected between a first set of nodes;
    at least one device connected to a second set of nodes of the plurality of elementary cells; and
    at least one resonant assembly, of which an inductive element comprises an inductor belonging to the electric battery, between the second set of nodes.

11. The electric battery as claimed in claim 10, wherein the at least one device is configured to modulate an alternating signal received by the second set of nodes.

12. The electric battery as claimed in claim 10, wherein the at least one resonant assembly comprises at least one capacitive element of the at least one device.

13. The electric battery as claimed in claim 10, wherein the at least one device is arranged within an elementary cell of the plurality of elementary cells of the electric battery.

14. The electric battery as claimed in claim 13, wherein the at least one device comprises a sensor configured to measure a temperature of an electrolyte of at least one elementary cell of the plurality of elementary cells.

15. A method for communicating in a battery in which a plurality of elementary cells are connected between a first set of two nodes, between a first device connected to the first set of two nodes and at least one second device connected to a second set of two nodes of the plurality of elementary cells, the method comprising:
    on a side of the first device, applying an alternating signal to the first set of two nodes; and on a side of the at least one second device, receiving the alternating signal via at least one resonant assembly, of which an inductive element comprises an inductor belonging to the battery, between the second set of two nodes, and modulating the alternating signal.

* * * * *